United States Patent
Takagi et al.

(10) Patent No.: US 12,368,386 B2
(45) Date of Patent: Jul. 22, 2025

(54) POWER CONVERSION DEVICE AND METHOD FOR MANUFACTURING POWER CONVERSION DEVICE

(71) Applicant: HITACHI ASTEMO, LTD., Hitachinaka (JP)

(72) Inventors: Yusuke Takagi, Hitachinaka (JP); Yujiro Kaneko, Hitachinaka (JP); Masanori Miyagi, Tokyo (JP); Xudong Zhang, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 174 days.

(21) Appl. No.: 18/041,105

(22) PCT Filed: Aug. 11, 2021

(86) PCT No.: PCT/JP2021/029686
§ 371 (c)(1),
(2) Date: Feb. 9, 2023

(87) PCT Pub. No.: WO2022/039093
PCT Pub. Date: Feb. 24, 2022

(65) Prior Publication Data
US 2024/0030827 A1    Jan. 25, 2024

(30) Foreign Application Priority Data
Aug. 18, 2020 (JP) .................. 2020-138301

(51) Int. Cl.
*H02M 7/00*  (2006.01)
*H01L 23/473*  (2006.01)
*H05K 7/20*  (2006.01)

(52) U.S. Cl.
CPC .......... *H02M 7/003* (2013.01); *H01L 23/473* (2013.01); *H05K 7/20927* (2013.01)

(58) Field of Classification Search
CPC ....... H01L 23/473; H01L 24/33; H01L 25/18; H01L 2924/13055; H01L 25/072;
(Continued)

(56) References Cited

U.S. PATENT DOCUMENTS 9,041,183 B2 *  5/2015  Liang .................. H01L 23/3735
                                                      257/691
10,504,819 B2 *  12/2019  Gutala ................ H01L 25/0657
(Continued)

FOREIGN PATENT DOCUMENTS

EP          0892487 A1   1/1999
JP      H-05-235221 A    9/1993
(Continued)

OTHER PUBLICATIONS

International Search Report with English Translation and Written Opinion dated Nov. 2, 2021 in corresponding International Application No. PCT/JP2021/029686.

*Primary Examiner* — Michael A Matey
(74) *Attorney, Agent, or Firm* — Foley & Lardner LLP

(57) ABSTRACT

A power conversion device including: a semiconductor device; a first water channel and a second water channel stacked in a predetermined stacking direction and installed with the semiconductor device interposed therebetween; and a connecting water channel connecting the first water channel and the second water channel, in which the connecting water channel is formed by joining and fixing a joint member joined to the first water channel and the second water channel and a cover member separate from the joint member to each other, the first water channel and the second water channel are joined to the joint member by a joint formed in a plane parallel to the stacking direction, and the cover member covers the joint and is joined and fixed to the joint member.

7 Claims, 16 Drawing Sheets

(58) Field of Classification Search
CPC ..... H01L 2924/181; H01L 2224/33181; H01L 23/3735; H01L 21/50; H01L 23/34; H01L 23/36; H01L 23/4012; H01L 25/117; H05K 7/20927; H05K 7/20263; H05K 7/20272; B60H 1/00571; F28F 1/40; F28F 3/12; H01F 27/2876; H02M 7/003

See application file for complete search history.

(56) References Cited

U.S. PATENT DOCUMENTS

| | | | | |
|---|---|---|---|---|
| 10,727,173 | B2* | 7/2020 | Park | H01L 23/492 |
| 2006/0138452 | A1* | 6/2006 | Knapp | H01L 25/072 |
| | | | | 257/E23.101 |
| 2013/0306273 | A1* | 11/2013 | Iyengar | H01L 23/473 |
| | | | | 165/104.19 |
| 2014/0091452 | A1* | 4/2014 | Katou | H01L 23/34 |
| | | | | 257/706 |
| 2015/0152987 | A1* | 6/2015 | Ishikawa | H05K 7/20927 |
| | | | | 285/350 |
| 2015/0289411 | A1 | 10/2015 | Kamiya et al. | |
| 2018/0064000 | A1 | 3/2018 | Uneme et al. | |
| 2020/0367353 | A1* | 11/2020 | Yahara | H05K 1/0203 |
| 2022/0059432 | A1* | 2/2022 | Iizuka | H01L 25/18 |
| 2023/0189487 | A1* | 6/2023 | Kwon | H01L 23/4735 |
| | | | | 361/699 |
| 2023/0200008 | A1* | 6/2023 | Lee | H05K 7/20272 |
| | | | | 361/699 |
| 2023/0371200 | A1* | 11/2023 | Lee | H05K 7/20272 |

FOREIGN PATENT DOCUMENTS

| | | |
|---|---|---|
| JP | 2012-210022 A | 10/2012 |
| JP | 2014-108014 A | 6/2014 |
| JP | 2014-230349 A | 12/2014 |
| JP | 2015-109322 A | 6/2015 |
| JP | 2018-007374 A | 1/2018 |
| JP | 2018-038117 A | 3/2018 |

* cited by examiner

POWER CONVERSION DEVICE AND METHOD FOR MANUFACTURING POWER CONVERSION DEVICE

TECHNICAL FIELD

The present invention relates to a power conversion device.

BACKGROUND ART

In the field of power conversion devices, a structure in which water channels with fins are installed on both surfaces of a molded body has been studied for a next-generation double-sided cooling power module. The conventional structure with this configuration has a structure in which a molded body is inserted into a water channel after the connection portion between water channels is welded, and then the water channels are press-contacted to the molded body so that the water channels are in close contact with the both surfaces of the molded body.

As a background art of the present invention, the following Patent Literature 1 is known. Patent Literature 1 discloses a technique in which water channels are plastically deformed by close contact between a molded body and the water channels, and spring back is suppressed by a pressing member using a spring.

CITATION LIST

Patent Literature

PTL 1: JP 2014-230349 A

SUMMARY OF INVENTION

Technical Problem

In the conventional structure described in Patent Literature 1, since spring back occurs in the water channel deformation portion, a structure against spring back force for maintaining close contact between the water channels and the molded body is required. In view of this, an object of the present invention is to provide a power conversion device that can be assembled without spring back and achieves both downsizing and improvement in heat dissipation.

Solution to Problem

A power conversion device including: a semiconductor device; a first water channel and a second water channel stacked in a predetermined stacking direction and installed with the semiconductor device interposed therebetween; and a connecting water channel connecting the first water channel and the second water channel, in which the connecting water channel is formed by joining and fixing a joint member joined to the first water channel and the second water channel and a cover member separate from the joint member to each other, the first water channel and the second water channel are joined to the joint member by a joint formed in a plane parallel to the stacking direction, and the cover member covers the joint and is joined and fixed to the joint member.

Advantageous Effects of Invention

It is possible to provide a power conversion device that achieves both downsizing and improvement in heat dissipation.

DESCRIPTION OF EMBODIMENTS

Figure 1:
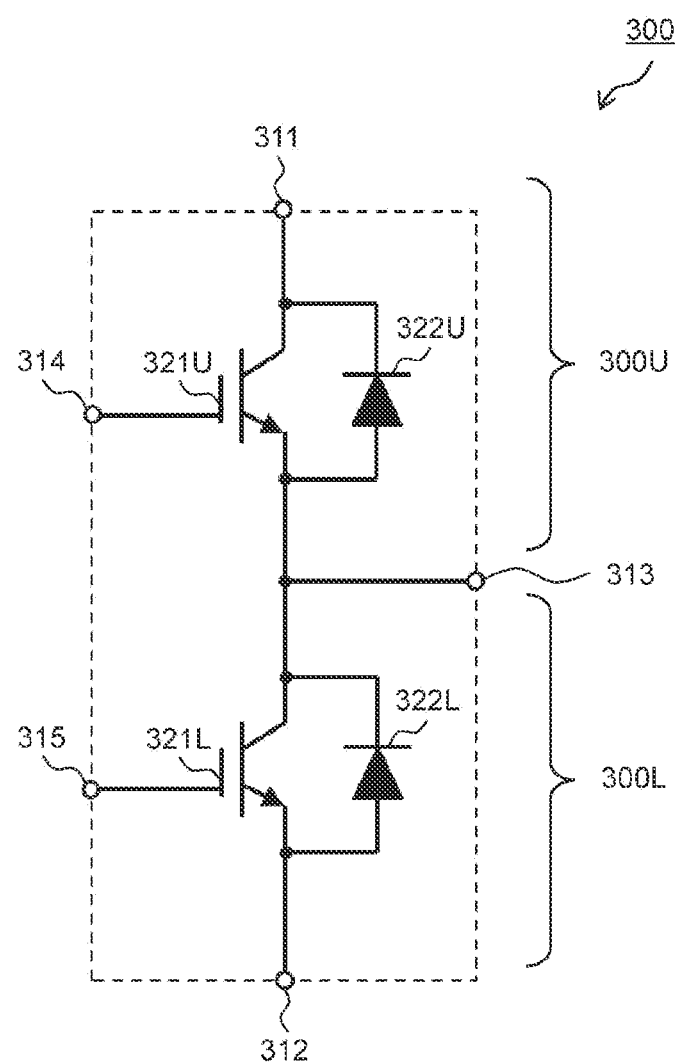
FIG. 1 is a circuit diagram of a molded body of the present invention.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

The positions, sizes, shapes, ranges, and the like of the components shown in the drawings and the like may not represent actual positions, sizes, shapes, ranges, and the like in order to facilitate understanding of the invention. For this reason, the present invention is not necessarily limited to the position, size, shape, range, etc. disclosed in the drawings and the like.

First Embodiment and its Configuration

FIG. 1 is a circuit diagram of a molded body of the present invention.

A molded body 300 is a semiconductor device using a configuration of an insulated gate bipolar transistor (IGBT), and includes an IGBT 321U, an IGBT 321L, a diode 322U, and a diode 322L which are power semiconductor elements.

The molded body 300 includes an upper arm 300U and a lower arm 300L, the upper arm 300U includes an IGBT 321U and a diode 322U, and the lower arm 300L includes an IGBT 321L and a diode 322L. The IGBT 321U, the IGBT 321L, the diode 322U, and the diode 322L can be replaced with a field effect transistor (FET) or the like.

The upper arm 300U has a DC positive terminal 311 and a signal terminal 314, and the lower arm 300L has a DC negative terminal 312 and a signal terminal 315. The DC positive terminal 311 and the DC negative terminal 312 are connected to a capacitor (not shown) or the like, and supply electric power from the outside to the molded body 300. The signal terminals 314 and 315 are connected to a control board (not illustrated) and control a switching operation of the power semiconductor element.

The molded body 300 includes an AC terminal 313. The AC terminal 313 electrically connects the upper arm 300U and the lower arm 300L, and outputs an AC current to the outside of the molded body 300.

Figure 2:
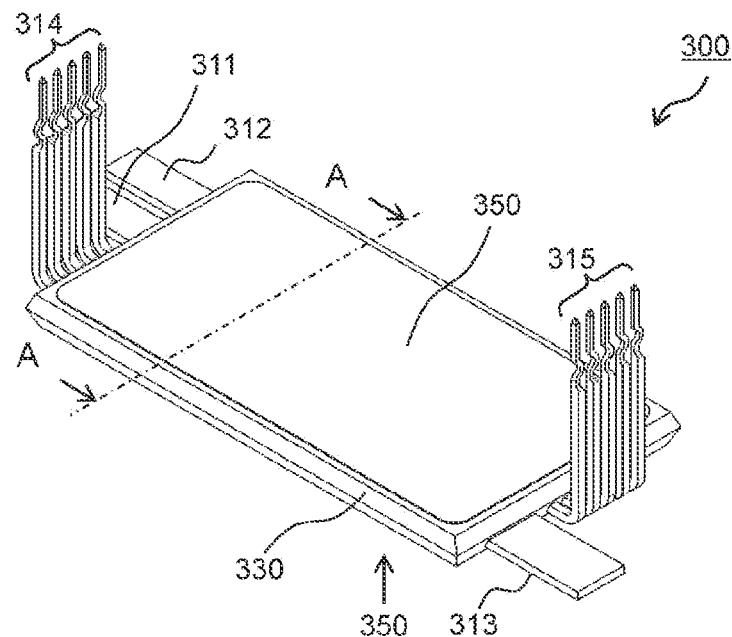
FIG. 2 is an external view of a molded body of the present invention.

FIG. 2 is an external view of the molded body of the present invention. Note that an A-A cross section will be described later with reference to FIG. 3.

A part of the molded body 300 is sealed with a sealing resin 330. The DC positive terminal 311, the DC negative terminal 312, the AC terminal 313, and the signal terminals 314 and 315 are exposed to the outside from the sealing resin 330 portion of the molded body 300. The molded body 300 has heat conducting members 350 on both surfaces.

Figure 3:
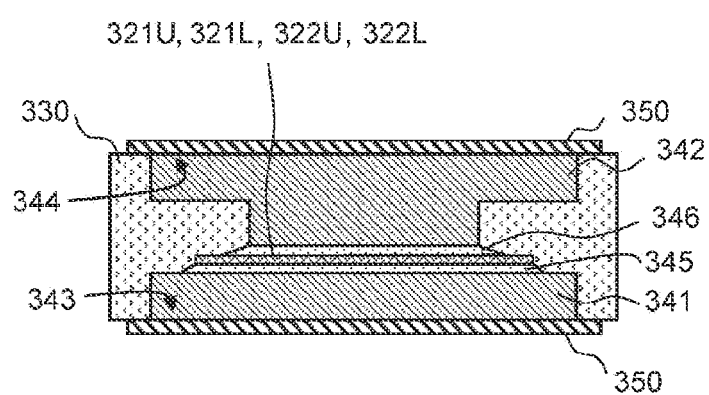
FIG. 3 is a cross-sectional view taken along line A-A of FIG. 2.

FIG. 3 is a cross-sectional view taken along line A-A of FIG. 2.

Main surfaces (surfaces on the lower side in the drawing) of the power semiconductor elements 321U, 321L, 322U, and 322L are joined to a first heat sink 341 via a first joining material 345, and surfaces opposite to the main surfaces are joined to a second heat sink 342 via a second joining material 346.

The first joining material 345 and the second joining material 346 are solder or a sintered material. The first heat sink 341 and the second heat sink 342 are metal such as copper or aluminum, or an insulating substrate having a copper wiring.

The sealing resin 330 seals the joined semiconductor elements 321U, 321L, 322U, and 322L, the first heat sink 341, and the second heat sink 342.

The first heat sink 341 has a first heat dissipation surface 343. The first heat dissipation surface 343 is located on a surface opposite to a surface of the first heat sink 341 joined to the first joining material 345. Similarly, the second heat sink 342 has a second heat dissipation surface 344. The second heat dissipation surface 344 is located on a surface opposite to a surface of the second heat sink 342 joined to the second joining material 346.

The first heat sink 341 and the second heat sink 342 are partially in contact with the sealing resin 330, and the surfaces opposite to the contact surfaces with the first heat sink 341 and the second heat sink 342 are in contact with the heat conducting member 350 without being sealed by the sealing resin 330.

The heat conducting member 350 is made of resin or ceramic having insulating performance, and in the case of being made of ceramic, the heat conducting member is in close contact with the molded body 300 via the first water channel 101 (described later), the second water channel 102 (described later), grease or the like. The heat conducting member 350 is grease when an insulating board or a resin insulating member is provided inside the molded body 300. The heat conducting member 350 may be solder as long as there is no problem in the configuration. In the case of solder, since the contact thermal resistance is small, there is an advantage that heat dissipation is good.

Figure 4:
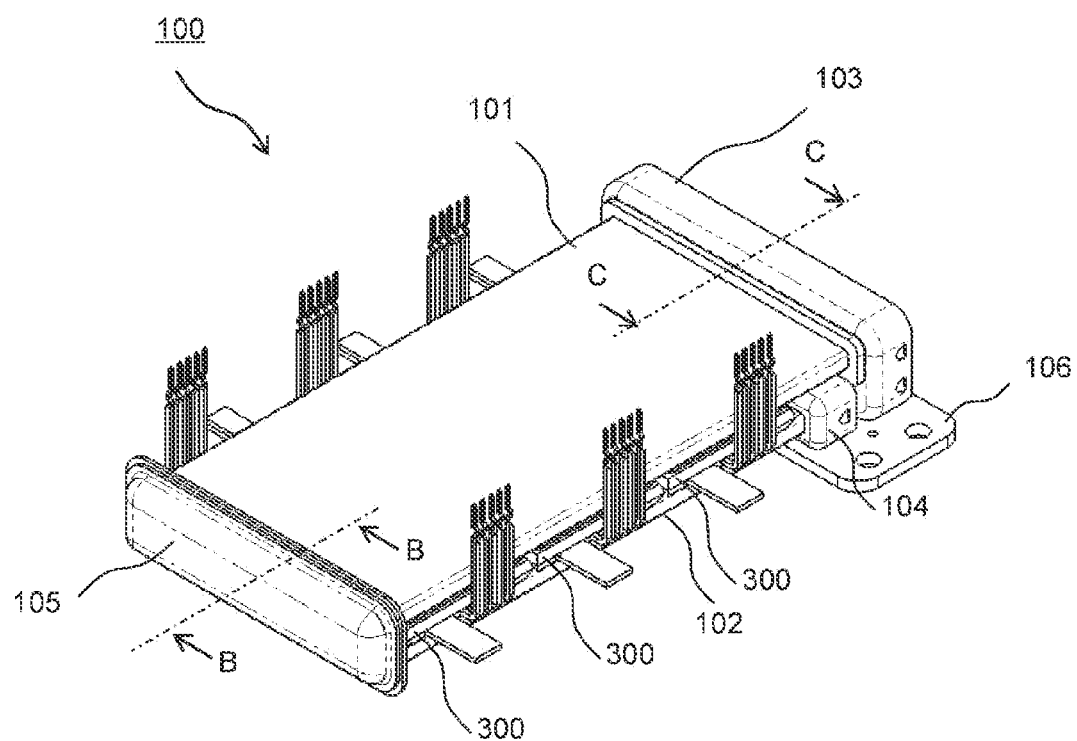
FIG. 4 is an external view of a power conversion device according to a first embodiment of the present invention.

FIG. 4 is an external view of the power conversion device according to the first embodiment of the present invention. Note that a B-B cross section will be described later with reference to FIG. 6, and a C-C cross section will be described later with reference to FIG. 7.

A power module 100 is a part of a power conversion device including a functional unit of a switching element in which three molded bodies 300 form a U phase, a V phase, and a W phase of a three-phase inverter, and a water channel for cooling the functional unit. In the power module 100, a plurality of molded bodies 300 for a three-phase inverter may be mounted, or a molded body for boosting may be mounted.

The power module 100 is a semiconductor device having a first water channel 101 and a second water channel 102 formed so as to cover the molded body 300. The molded body 300 is thermally connected to the first water channel 101 and the second water channel 102 so as to be sandwiched between the first water channel 101 and the second water channel 102.

The first water channel 101 and the second water channel 102 are stacked in a predetermined stacking direction, and a refrigerant for cooling the molded body 300 flows in the first water channel and the second water channel. The refrigerant enters through a first header 103 and a second header 104.

The first header 103 is connected to the first water channel 101 and a flange 106. The second header 104 is connected to the second water channel 102 and the flange 106. The flange 106 is provided in a case (not illustrated) for attaching the power module 100 to the power conversion device, and is provided with an inlet/outlet (described later) for supplying the refrigerant from the outside of the power module 100.

A connecting water channel 105 is a connecting member connected and fixed to the first water channel 101 and the second water channel 102. As a result, the refrigerant for cooling the power module 100 flows, for example, in the order of the flange 106, the first header 103, the first water channel 101, the connecting water channel 105, the second water channel 102, the second header 104, and the flange 106. The refrigerant flow may be reversed in this order.

Figure 5:
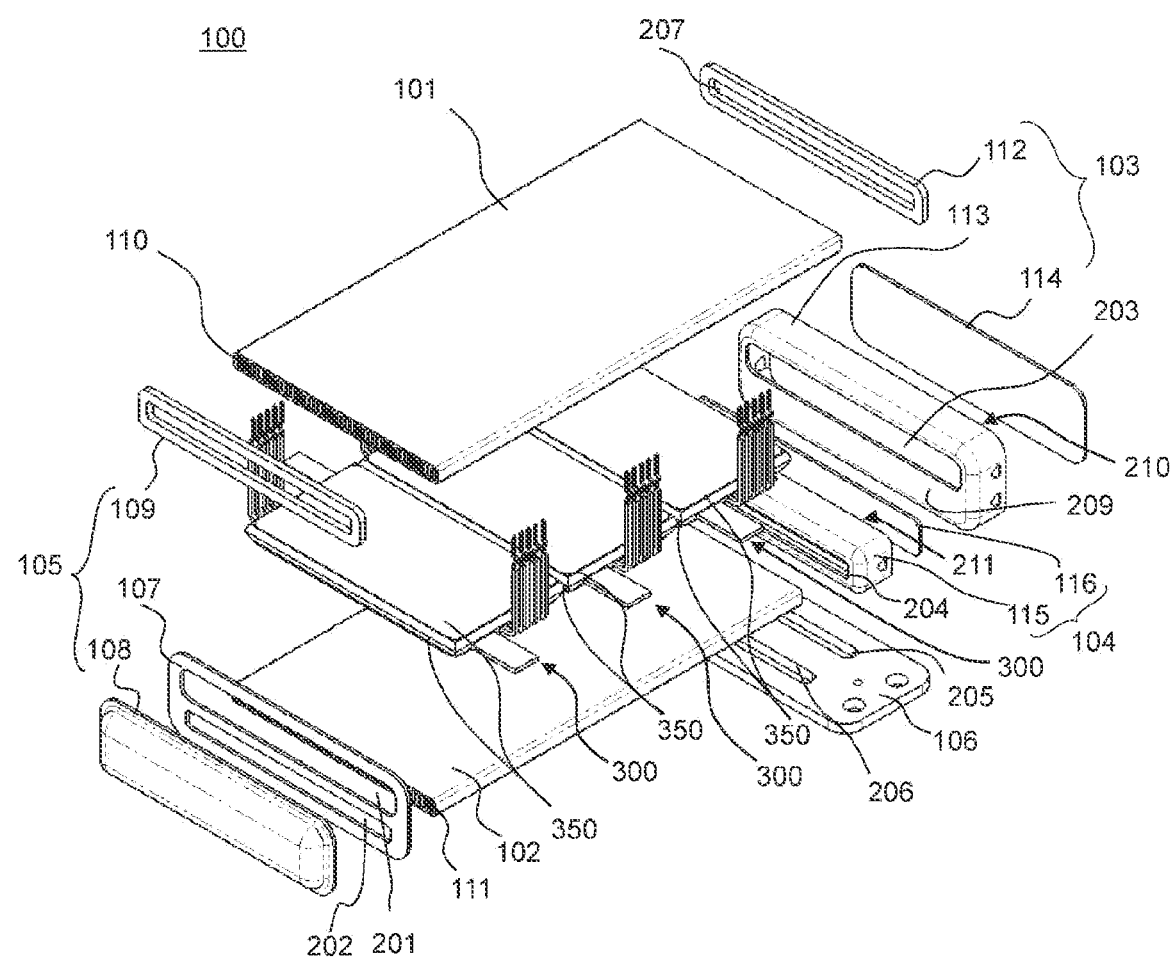
FIG. 5 is an exploded view of FIG. 4.

FIG. 5 is an exploded view of FIG. 4.

The molded body 300 is in close contact with the first water channel 101 and the second water channel 102 via the heat conducting member 350. The degree of heat dissipation of the power module 100 changes depending on the degree of close contact.

The first water channel 101 has a first fin 110 therein, and the second water channel 102 has a second fin 111 therein. The refrigerant flows through the first fin 110 and the second fin 111 in a conductive manner to cool the molded body 300.

The first header 103 includes a header flange 112, a first header case 113, and a first header cover 114. The first water channel 101 is joined to the header flange 112 via a header flange opening 207 for attachment to the first header 103.

The header flange 112 is joined to a first header case outer surface 209 of the first header case 113 on the side opposite to the side of the header flange opening 207 joined to the first water channel 101.

The first header case 113 has a first header opening 203 and a third header opening 210, and the first header opening 203 is at a position facing the third header opening 210. The third header opening 210 is closed by the first header cover 114.

The second header case 115 has a second header opening 204 and a fourth header opening 211. The second header opening 204 is at a position facing the fourth header opening 211 and is joined to the second water channel 102. The fourth header opening 211 is closed by a second header cover 116.

The flange 106 has a first flange opening 205 and a second flange opening 206. The first flange opening 205 is connected to the first header 103 in a plane perpendicular to a plane of the first header case 113 on which the first header opening 203 is provided. The second flange opening 206 is connected to the second header 104 in a plane perpendicular to a plane of the second header case 115 on which the second header opening 204 is provided.

As a result, when the refrigerant flows in the direction of the water channel 101→the water channel 102, the refrigerant flows to the first water channel 101 via the first flange opening 205 and the first header opening 203, flows through the second water channel 102, and then flows to the outside via the second flange opening 206 and the second header opening 204.

The connecting water channel 105 includes a connecting water channel cover 108, a connecting water channel base 107, and a connecting water channel flange 109. The connecting water channel base 107 is a joint member having a first connecting water channel opening 201 and a second connecting water channel opening 202. The first connecting water channel opening 201 is joined to the first water channel 101 via the connecting water channel flange 109, and the second connecting water channel opening 202 is joined to the second water channel 102. The surface of the connecting water channel base 107 opposite to the surface joined to the water channels 101 and 102 is joined to the connecting water channel cover 108 which is a separate member.

The water channels 101 and 102 and the connecting water channel 105 are joined to each other by a joint formed on a plane parallel to the stacking direction of the first water channel 101 and the second water channel 102, that is, a plane perpendicular to the flow direction of the refrigerant flowing in the first water channel 101 (described later). As a result, the connecting water channel 105 through which the refrigerant is conducted is formed from the first water channel 101 to the second water channel 102.

The first water channel 101 and the second water channel 102, the flange 106, the connecting water channel base 107, the connecting water channel cover 108, the connecting water channel flange 109, the header flange 112, the first header case 113, the first header cover 114, the second header case 115, and the second header cover 116 are aluminum or an aluminum alloy or copper or a copper alloy.

Figure 6:
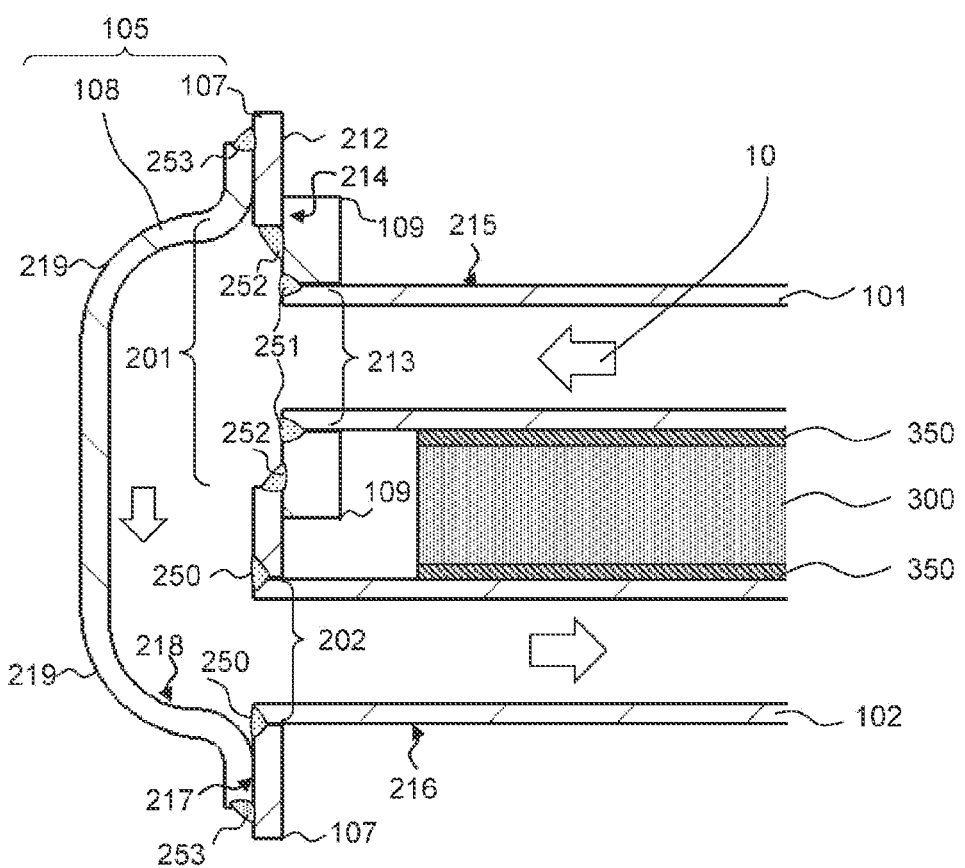
FIG. 6 is a cross-sectional view taken along line B-B of FIG. 4.

FIG. 6 is a cross-sectional view taken along line B-B of FIG. 4.

The molded body 300 is closely fixed so as to be sandwiched between the first water channel 101 and the second water channel 102 via the heat conducting member 350.

The connecting water channel flange 109 has a connecting water channel flange opening 213. The connecting water channel flange opening 213 is joined to the first water channel outer surface 215 of the first water channel 101 by formation of a second joint 251. The connecting water channel flange 109 may be integrated with the first water channel 101 from the beginning by machining or the like.

The connecting water channel flange 109 has a connecting water channel flange outer surface 214 positioned perpendicular to the extending direction of the connecting water channel flange opening 213. The connecting water channel 105 includes the connecting water channel base 107 and the connecting water channel cover 108. The connecting water channel cover 108 is a cover member separate from the connecting water channel base 107. In the manufacturing step of the power module 100, the first water channel 101, the connecting water channel flange 109, and the connecting water channel base 107 are laser-welded, so that the inside of the water channel can be easily welded (described later).

The connecting water channel base 107 has an outer surface 212 of the connecting water channel. The connecting water channel flange outer surface 214 of the connecting water channel flange 109 is in contact with the connecting water channel outer surface 212. The connecting water channel base 107 has a first connecting water channel opening 201 and a second connecting water channel opening 202 which are opened along the connecting water channel outer surface 212.

The first connecting water channel opening 201 has a larger opening portion than the connecting water channel flange opening 213. Thus, the first water channel 101, the connecting water channel flange 109, and the connecting water channel base 107 can be laser-welded at a time (described later).

The connecting water channel outer surface 212 is joined to the connecting water channel flange outer surface 214 by formation of a third joint 252. Although not illustrated, the third joint 252 may be lap welded. Similarly, the second connecting water channel opening 202 is joined to a second water channel outer surface 216 of the second water channel 102 by formation of a first joint 250.

The connecting water channel base 107 has a connecting water channel base inner surface 217 on a surface opposite to the outer surface 212 of the connecting water channel. The connecting water channel cover 108 has a connecting water channel cover inner surface 218 that is a surface in contact with the connecting water channel base 107. The connecting water channel cover 108 is formed to be larger than the area of the region of the connecting water channel base 107 including the openings 201 and 202, and is joined to the connecting water channel base 107 by formation of a fourth joint 253. As a result, a refrigerant flow path in which the first water channel 101, the connecting water channel 105, and the second water channel 102 communicate with each other is completed.

In FIG. 6, the fourth joint 253 is formed on the outer peripheral side of the power module 100 with respect to the openings 201 and 202 of the connecting water channel base 107.

The connecting water channel cover 108 has a convex shape in a direction facing a position where the molded body 300 is disposed with the connecting water channel base 107 interposed therebetween, and has curved portions 219 at both ends of the convex shape. The curved portion 219 can reduce the pressure loss of the flow of the refrigerant as compared with an angular shape.

Figure 7:
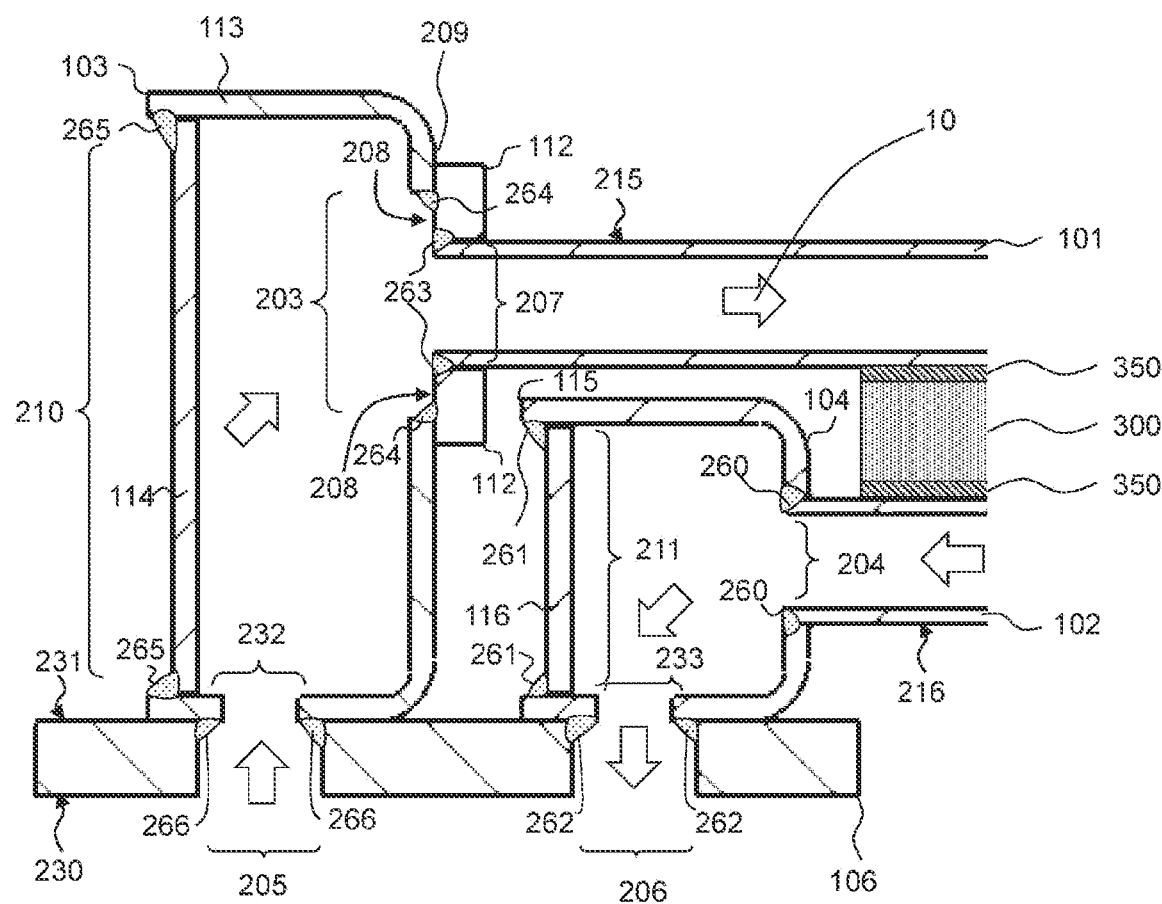
FIG. 7 is a cross-sectional view taken along line C-C of FIG. 4.

FIG. 7 is a cross-sectional view taken along line C-C of FIG. 4.

The header flange 112 has the header flange opening 207. The header flange opening 207 is joined to the first water channel outer surface 215 of the first water channel 101 by formation of an eighth joint 263.

The header flange 112 has a header flange outer surface 208 on a side vertically adjacent to the header flange opening 207. The header flange outer surface 208 is joined to the first header case outer surface 209 of the first header case 113 by formation of a ninth joint 264.

The first header case 113 has a first header opening 203, a third header opening 210, and a fifth header opening 232. The first header opening 203 is at a position facing the third header opening 210. The third header opening 210 is joined to the first header cover 114 by formation of a tenth joint 265, thereby closing the inside of the first header 103.

The second header case 115 has a second header opening 204, a fourth header opening 211, and a sixth header opening 233. The second header opening 204 is at a position facing the fourth header opening 211. The second header opening 204 is joined to the second water channel outer surface 216 of the second water channel 102 by formation of a fifth joint 260.

The fourth header opening 211 is joined to the second header cover 116 by formation of a sixth joint 261, thereby closing the inside of the second header 104.

The fifth header opening 232 is located on a plane perpendicular to the plane on which the first header opening 203 is provided. The sixth header opening 233 is located on a plane perpendicular to the plane on which the second header opening 204 is provided.

The flange 106 has a casing mounting surface 230 and has a header mounting surface 231 on a surface opposite to the casing mounting surface 230. The casing mounting surface 230 is a mounting for installing the power module 100 in a case where the refrigerant is supplied and discharged.

Further, the flange 106 has the first flange opening 205 and the second flange opening 206. With the flange 106, the input/output portion of the refrigerant can be integrated by one member, and the productivity is improved as compared with the case where the input/output portion is divided into the inlet and the outlet.

The first header case 113 is disposed at a position in contact with the header mounting surface 231. The second header case 115 is disposed at a position in contact with the header mounting surface 231.

The first flange opening 205 is joined to the fifth header opening 232 of the first header case 113 by formation of an eleventh joint 266. The first flange opening 205 has a size larger than that of the fifth header opening 232, and can be joined by laser welding from the outside of the first flange opening 205. Although not illustrated, the eleventh joint 266 may be lap welded.

The second flange opening 206 is joined to the sixth header opening 233 of the second header case 115 by formation of a seventh joint 262. The second flange opening 206 has a size larger than that of the sixth header opening 233, and enables laser welding from the second flange opening 206. Although not illustrated, the seventh joint 262 may be lap welded.

The refrigerant flows to the first water channel 101 via the first flange opening 205→the fifth header opening 232→the first header case opening 203. After passing through the first water channel 101, the refrigerant returning to the second water channel 102 via the connecting water channel 105 flows out of the power module 100 through the opening 204→the second header case 115→the sixth header opening 233→the second flange opening 206.

Figure 8:
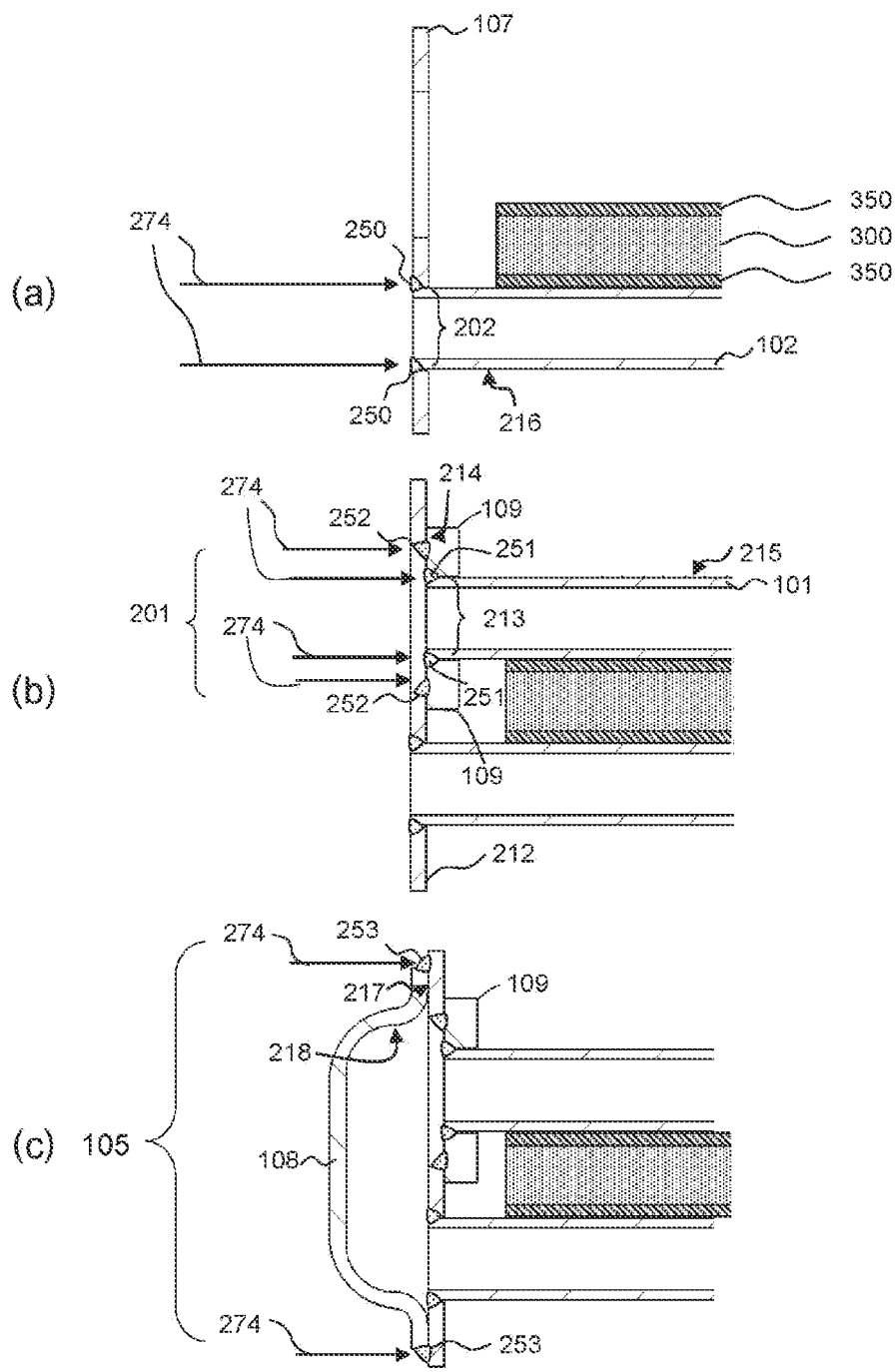
FIG. 8 is a manufacturing step of a connecting water channel according to the first embodiment of the present invention.

FIG. 8 is a manufacturing step of the connecting water channel according to the first embodiment of the present invention.

First, in FIG. 8(a), the heat conducting member 350 is attached to the molded body 300. Next, the molded body 300 and the heat conducting member 350 are attached to the second water channel 102. This step may be a step subsequent to laser welding 274 described later.

The second water channel 102 is inserted into a second connecting water channel base opening 202 of the connecting water channel base 107. In the second water channel 102, a second connecting water channel outer surface 216 is joined to the second connecting water channel base opening 202 by formation of the first joint 250 on a plane parallel to the stacking direction of the first water channel 101 and the second water channel 102, that is, the vertical direction in FIG. 8(a).

The first joint 250 is formed by laser welding 274 from the side of the connecting water channel base 107 opposite to the side where the molded body 300 is provided.

In FIG. 8(b), the first water channel 101 is inserted into the connecting water channel flange opening 213 of the connecting water channel flange 109. In the first water channel 101, the first water channel outer surface 215 is joined to the connecting water channel flange opening 213 by formation of the second joint 251 on a plane parallel to the stacking direction of the first water channel 101 and the second water channel 102, that is, the vertical direction in FIG. 8(b). This step may be a step subsequent to the step of attaching first water channel 101 to the heat conducting member 350 described later.

The first water channel 101 is attached to the heat conducting member 350 on a surface opposite to a surface on which the second water channel 102 is attached. The second joint 251 is formed by the laser welding 274 from the side of the connecting water channel flange 109 opposite to the side where the molded body 300 is provided through the first connecting water channel opening 201 of the connecting water channel base 107.

The outer surface 212 of the connecting water channel base 107 is joined to the connecting water channel flange outer surface 214 by formation of the third joint 252. The third joint 252 is formed by the laser welding 274 from the opposite side of the outer surface 212 of the connecting water channel in a plane parallel to the stacking direction of the first water channel 101 and the second water channel 102, that is, the vertical direction in FIG. 8(b). As a result, the first water channel 101 and the connecting water channel base 107 are joined via the connecting water channel flange 109.

At this time, the third joint 252 is formed in a state where the first water channel 101 is pressed so as to be in close contact with the heat conducting member 350, and the connecting water channel flange outer surface 214 and the connecting water channel outer surface 212 are joined. Consequently, the first water channel 101 and second water channel 202 can be fixed to the connecting water channel base 107 while the state in which the first water channel 101 and second water channel 102 are in close contact with the heat conducting member 350 with the molded body 300 interposed therebetween is maintained.

The adhesiveness of the heat conducting member 350, the molded body 300, the first water channel 101, and the second water channel 102 is determined by joining the outer surface 212 of the connecting water channel and the connecting water channel flange outer surface 214 as described above, and thus, it is possible to offset the variation in the thickness of the molded body 300 and to perform assembly while maintaining the adhesiveness.

In FIG. 8(*c*), the connecting water channel cover 108 is disposed such that the connecting water channel base inner surface 217 and the connecting water channel cover inner surface 218 are in contact with each other. The connecting water channel cover inner surface 218 is joined to the connecting water channel base inner surface 217 by formation of the fourth joint 253.

The fourth joint 253 is formed by the laser welding 274 from the side opposite to the side where the molded body 300 is provided with reference to the connecting water channel base 107. Accordingly, the connecting water channel cover 108 covers the first joint 250, the second joint 251, and the third joint 252, and is joined and fixed to the connecting water channel base 107, so that the connecting water channel 105 is formed.

The first joint 250 and the second joint 251 may be brazed. In the case of brazing, since the ambient temperature becomes high, the joining is performed in a state of not including the molded body 300 and the heat conducting member 350 The laser welding 274 can be substituted by TIG welding, MIG welding, FSW, FIPG, a water-resistant adhesive, or the like.

Figure 9:
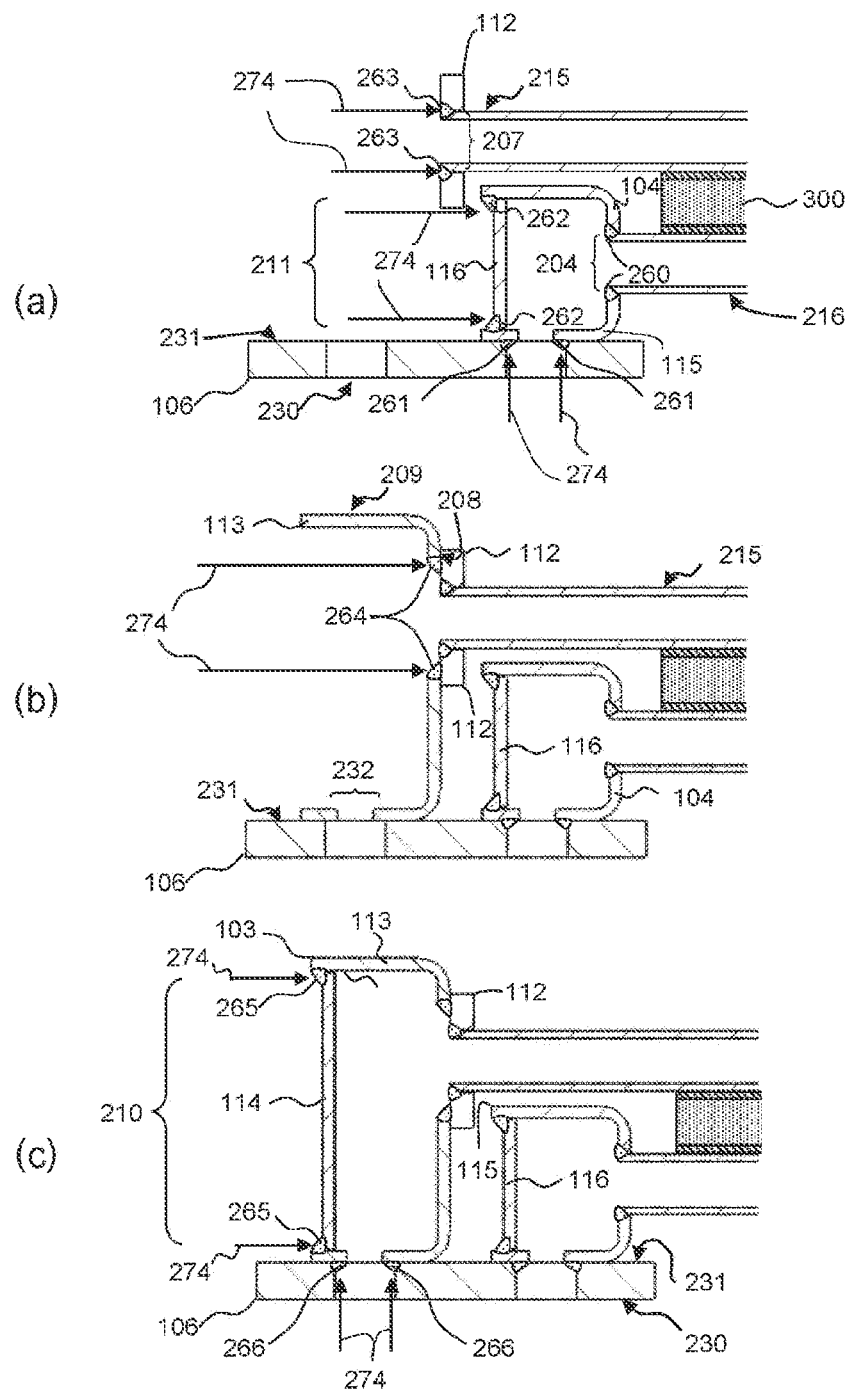
FIG. 9 is a manufacturing step of a header portion according to the first embodiment of the present invention.

FIG. 9 is a manufacturing step of the header portion according to the first embodiment of the present invention.

In FIG. 9(*a*), the second water channel 102 is inserted into the second header opening 204 of the second header case 115. The second water channel outer surface 216 of the second water channel 102 is joined to the second header opening 204 by forming the fifth joint 260 by laser welding 274.

The fifth joint 260 is formed by laser welding 274 from the opposite side where the molded body 300 is mounted. The second header case 115 abuts against the header mounting surface 231 of the flange 106. The second header case 115 is joined to the header mounting surface 231 with the sixth joint 261 formed by the laser welding 274. The sixth joint 261 is formed by the laser welding 274 from the casing mounting surface 230 side.

The second header cover 116 is inserted into the fourth header opening 211 of the second header case 115. The second header cover 116 is joined to the fourth header opening 211 by formation of the seventh joint 262 by laser welding 274.

The first water channel 101 is inserted into the header flange opening 207 of the header flange 112. The header flange opening 207 is joined to the first water channel outer surface 215 of the first water channel 101 by formation of the eighth joint 263 by laser welding 274.

The eighth joint 263 is formed from the side opposite to the side on which the molded body 300 is mounted with reference to the header flange 112.

Note that, in FIG. 9(*a*), the seventh joint 262 needs to be formed after the fifth joint 260, but any one of the fifth joint 260, the sixth joint 261, and the eighth joint 263 may be formed first.

In FIG. 9(*b*), the first header case 113 is disposed with the first header case outer surface 209 abutting against the header flange outer surface 208 of the header flange 112. In addition, the first header case 113 is disposed with the outer surface of the fifth header opening 232 abutting against the header mounting surface 231 of the flange 106.

In this state, the first header case 113 is joined to the header flange outer surface 208 by formation of the ninth joint 264 by laser welding 274. The ninth joint 264 is formed from the side opposite to the side on which the molded body 300 is mounted with reference to the header flange 112.

The first header cover outer surface 209 and the header flange outer surface 208 abut against each other, and laser welding 274 to be described later is performed while the first header cover outer surface and the header flange outer surface abut against the header mounting surface 231. This makes it possible to join the first header case 113 and the second header case 115 to the flange 106 while absorbing manufacturing variations in the stacking direction of the molded body 300, the first water channel 101, and the second water channel 102 by press contact.

In FIG. 9(*c*), the first header cover 114 is inserted into the third header opening 210. The first header cover 114 is joined to the third header opening 210 by formation of the tenth joint 265 by laser welding 274. The tenth joint 265 is joined from the opposite side where the molded body 300 is mounted with reference to the header flange 112.

The first header case 113 is joined to the header mounting surface 231 by formation of the eleventh joint 266 by laser welding 274. The eleventh joint 266 is formed from the casing mounting surface 230 side in the flange 106.

The laser welding 274 may be performed by a joining method such as brazing before the molded body 300 is installed in the second water channel 102. The laser welding 274 can be substituted by TIG welding, MIG welding, FSW, FIPG, a water-resistant adhesive, or the like.

According to the first embodiment of the present invention described above, the following operational effects are obtained.

(1) A power module 100 that is a power conversion device includes a molded body 300 that is a semiconductor device, a first water channel 101 and a second water channel 102 that are stacked in a predetermined stacking direction and installed with the molded body 300 interposed therebetween, and a connecting water channel 105 that connects the first water channel 101 and the second water channel 102. The connecting water channel 105 is formed by joining and fixing a connecting water channel base 107 which is a joint member joined to the first water channel 101 and the second water channel 102, and a connecting water channel cover 108 which is a cover member separated from the connecting water channel base 107. The first water channel 101 and the second water channel 102 are joined to the connecting water channel base 107 by a joint (first joint 250, second joint 251, third joint 252) formed on a plane parallel to the stacking direction of the first water channel 101 and the second water channel 102. The connecting water channel cover 108 covers these joints and is joined and fixed to the connecting water channel base 107. With this configuration, it is possible to provide a power conversion device that achieves both downsizing and improvement in heat dissipation.

(2) The joint of the power conversion device is formed by laser welding 274. Thus, the manufacturing step can be simplified.

(3) In a joint member 107 of the power conversion device, a first opening 201 for communicating with the first water channel 101 and a second opening 202 for communicating with the second water channel 102 are formed, and the cover member 108 is a member having an area larger than an area of a region including the first opening 201 and the second opening 202 of the joint member 107, and is joined and fixed to the joint member 107 on an outer peripheral side of the joints 250 to 252. In this way, not only the joinability of the members in the water channel connection is secured, but also the fluidity of the refrigerant flowing inside is secured.

(4) The cover member 108 of the power conversion device has a protruding shape having a curved portion 219. Thus, the pressure loss of the refrigerant flowing inside is reduced.

(5) The opening 213 for communicating with the first water channel 101 is formed in the joint member 107 of the power conversion device, and the first water channel 101 is joined to the joint member 107 on a plane perpendicular to the flow direction of the refrigerant flowing in the first water channel 101. In this way, the joining by the laser welding 274 is simplified.

(6) The power conversion device includes a flange member 109 having a flange opening 213 for inserting the first water channel 101, and the first water channel 101 is joined to the joint member 107 via the flange member 109 in a state of being inserted into the flange opening 213. In this way, the fixability in the joining of the water channels 101 and 102 and the connecting water channel 105 is enhanced.

In addition, according to the method for manufacturing the power conversion device of the present invention described above, the following operational effects are obtained.

(7) In a power conversion device including: a semiconductor device; a first water channel 101 and a second water channel 102 which are stacked in a predetermined stacking direction and installed with the semiconductor device interposed therebetween; and a connecting water channel 105 that connects the first water channel 101 and the second water channel 102, a method for manufacturing the power conversion device is performed, the method including: joining the second water channel 102 and a joint member 107; inserting the first water channel 101 into a flange member 109; joining the flange member 109 into which the first water channel 101 is inserted and the joint member 107 in a state where the semiconductor device is sandwiched between the first water channel 101 and the second water channel 102; and forming the connecting water channel 105 by covering a joint between the joint member 107 and the flange member 109 and a joint between the second water channel 102 and the joint member 107 and by joining and fixing a cover member 108 separate from the joint member 107 to the joint member 107. Since such a manufacturing method is performed, it is possible to provide a power conversion device that achieves both downsizing and improvement in heat dissipation.

Second Embodiment

Figure 10:
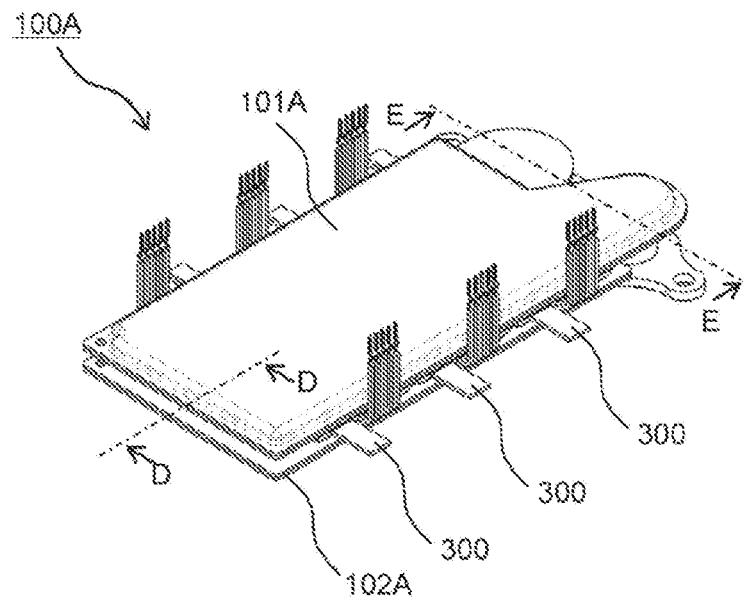
FIG. 10 is an external view of a power conversion device according to a second embodiment of the present invention.

FIG. 10 is an external view of a power conversion device according to a second embodiment of the present invention. Note that a cross-sectional view taken along line D-D will be described later with reference to FIG. 12, and a cross-sectional view taken along line E-E will be described later with reference to FIG. 13.

A power module 100A includes a molded body 300, a first water channel 101A, and a second water channel 102A.

The molded body 300 is disposed so as to be sandwiched between the first water channel 101A and the second water channel 102A, and is thermally connected. In the first water channel 101A and the second water channel 102A, the refrigerant flows in the respective water channels to cool the molded body 300.

The molded body 300 is one of a U phase, a V phase, and a W phase of a three-phase inverter, and the power module 100A may be mounted with a molded body for boosting. A plurality of molded bodies 300 for a three-phase inverter may be mounted on the power module 100A.

Figure 11:
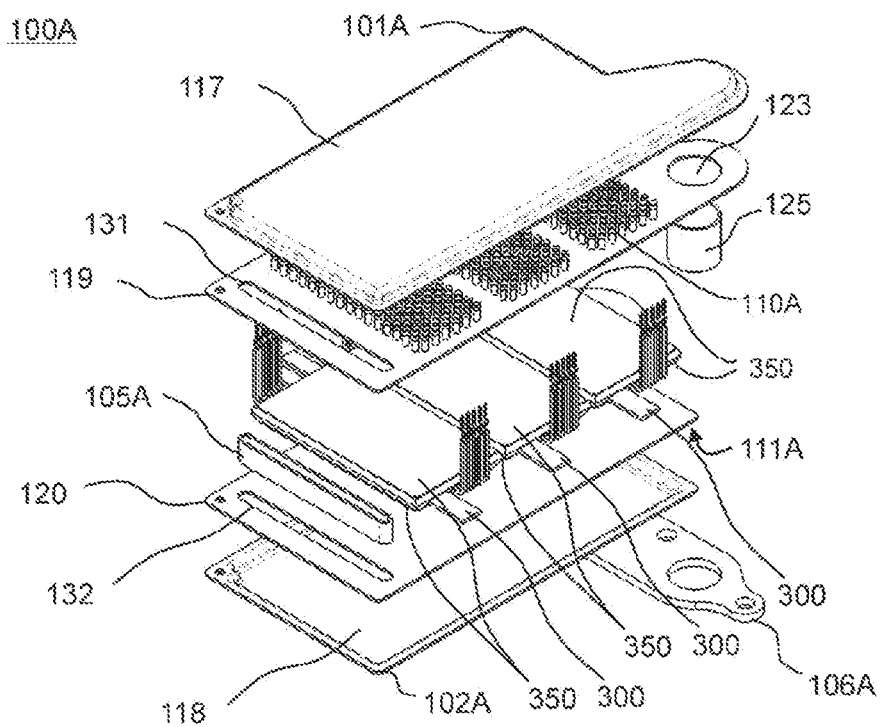
FIG. 11 is an exploded view of FIG. 10.

FIG. 11 is an exploded view of FIG. 10.

The first water channel 101A includes a first water channel cover 117, a first water channel base 119, and first fins 110A. The first fins 110A are provided on the main surface of the first water channel base 119 so as to be covered by the first water channel cover 117.

The second water channel 102A includes a second water channel cover 118, a second water channel base 120, and second fins 111A (not shown, installed on the back side of the second water channel base 120A). The second fins 111A are installed on the main surface of the second water channel base 120 so as to be covered by the second water channel cover 118.

The heat conducting member 350 is in contact with a surface of the first water channel base 119 on a side opposite to the main surface of the first water channel base 119 on which the first fins 110A are installed. The heat conducting member 350 is in contact with the surface of the second water channel base 120 opposite to the main surface on which the second fins 111A are installed.

The first water channel base 119 has a first water channel opening 131. The second water channel base 120 has a second water channel opening 132. The connecting water channel 105A is attached to the first water channel opening 131 and the second water channel opening 132. The connecting water channel 105A connected to the first water channel opening 131 and the second water channel opening 132 allows the refrigerant to flow through the first water channel 101A and the second water channel 102A. The molded body 300 and the heat conducting member 350 have the same configuration as that of the first embodiment.

The refrigerant passing through the first water channel 101A and the second water channel 102A is conducted through the third water channel base opening 123 via a water channel pipe 125 and a flange 106A. Details will be described later.

Figure 12:
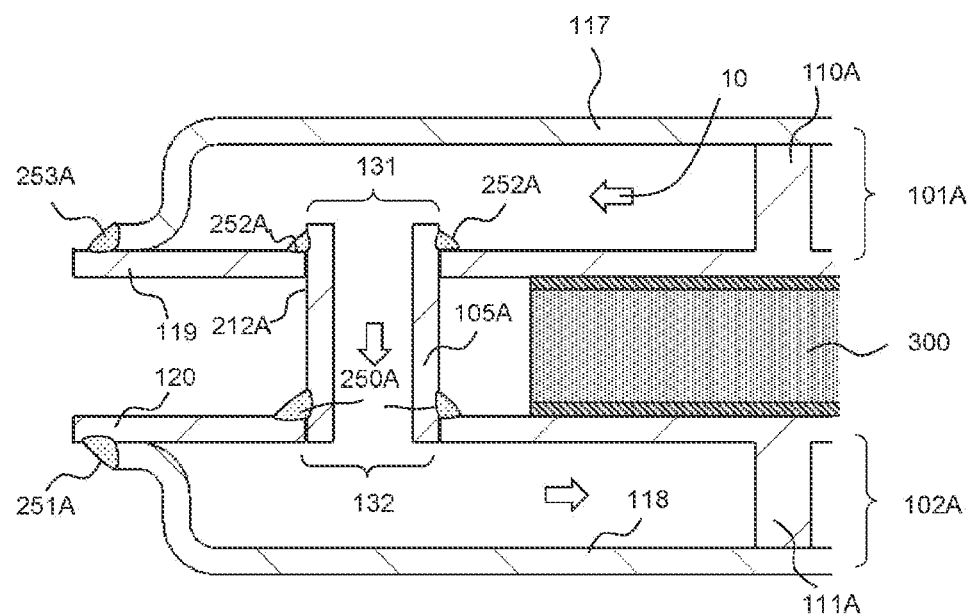
FIG. 12 is a cross-sectional view taken along line D-D of FIG. 10.

FIG. 12 is a cross-sectional view taken along line D-D of FIG. 10.

The connecting water channel 105A has a connecting water channel outer surface 212A. The connecting water channel outer surface 212A is joined to a second water channel opening 132 by formation of a first joint 250A. The first joint 250A may be formed on either the second fin 111A side of the second water channel base 120 or the side in contact with the molded body 300 with reference to the second water channel 102A.

The first water channel base 119 is joined to the first water channel cover 117 by formation of a fourth joint 253A. The second water channel base 120 is joined to the second water channel cover 118 by formation of a second joint 251A. The first water channel cover 117 and the second water channel cover 118 are separate cover members.

The connecting water channel outer surface 212A is joined to a first water channel opening 131 by formation of a third joint 252A. The third joint 252A and the fourth joint 253A are joined on the side of the first water channel base 119 on which the first fin 110A is installed.

The third joint 252A and the fourth joint 253A are formed by laser welding, but the first joint 250A and the second joint 251A may be formed by laser welding or brazing.

As a result, the first water channel 101A and the second water channel 102A are connected via the connecting water channel 105A, and the connecting water channel 105A is joined to the first water channel 101A and the second water channel 102A on a plane perpendicular to the stacking direction of the first water channel 101A and the second water channel 102A.

Figure 13:
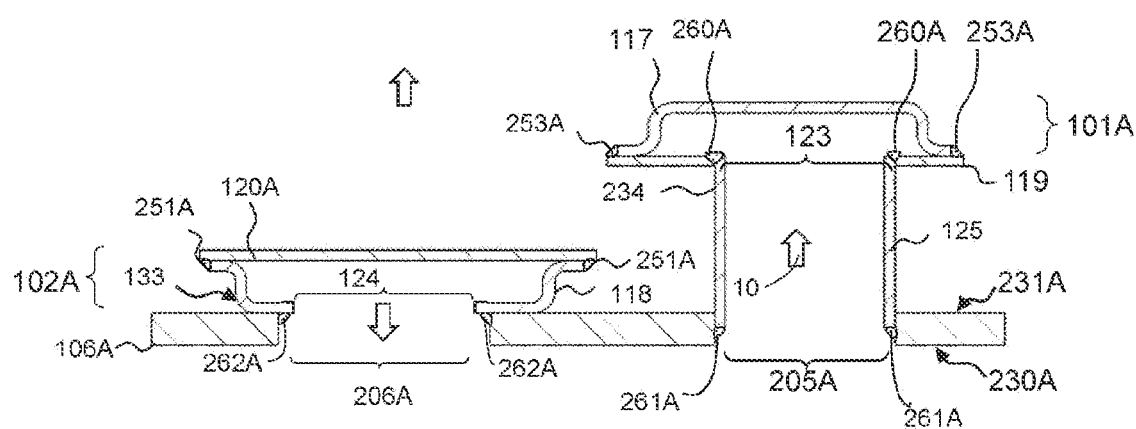
FIG. 13 is a cross-sectional view taken along line E-E of FIG. 10.

FIG. 13 is a cross-sectional view taken along line E-E of FIG. 10.

The first water channel base 119 has a third water channel base opening 123.

The flange 106A has a casing mounting surface 230A, and has a water channel mounting surface 231A on a surface opposite to the casing mounting surface 230A. The casing mounting surface 230A is a surface installed in a case where the refrigerant is supplied and discharged.

Further, the flange 106A has a first flange opening 205A and a second flange opening 206A. The first flange opening 205A allows a refrigerant supplied from the outside to flow into the first water channel 101A through the water channel pipe 125.

The water channel pipe 125 has a water channel pipe outer surface 234. The water channel pipe outer surface portion 234 is joined to the third water channel base opening 123 by formation of a fifth joint 260A, and is joined to the first flange opening 205A by formation of a sixth joint 261A.

The second water channel cover 118 has a second water channel cover opening 124 and a second water channel cover outer surface portion 133. The second water channel cover outer surface portion 133 is joined to a water channel mounting surface 231A by formation of a seventh joint 262A. As a result, the second water channel 102A is closely fixed to the flange 106A.

The refrigerant flowing from the second water channel 102A is discharged to the outside of the power module 100A via the second water channel cover opening 124 and the second flange opening 206A. As a result, in the flange 106A, the input/output portion of the refrigerant can be integrated by one member, and the productivity is improved as compared with the case where the flange is divided into the inlet and the outlet.

Figure 14:
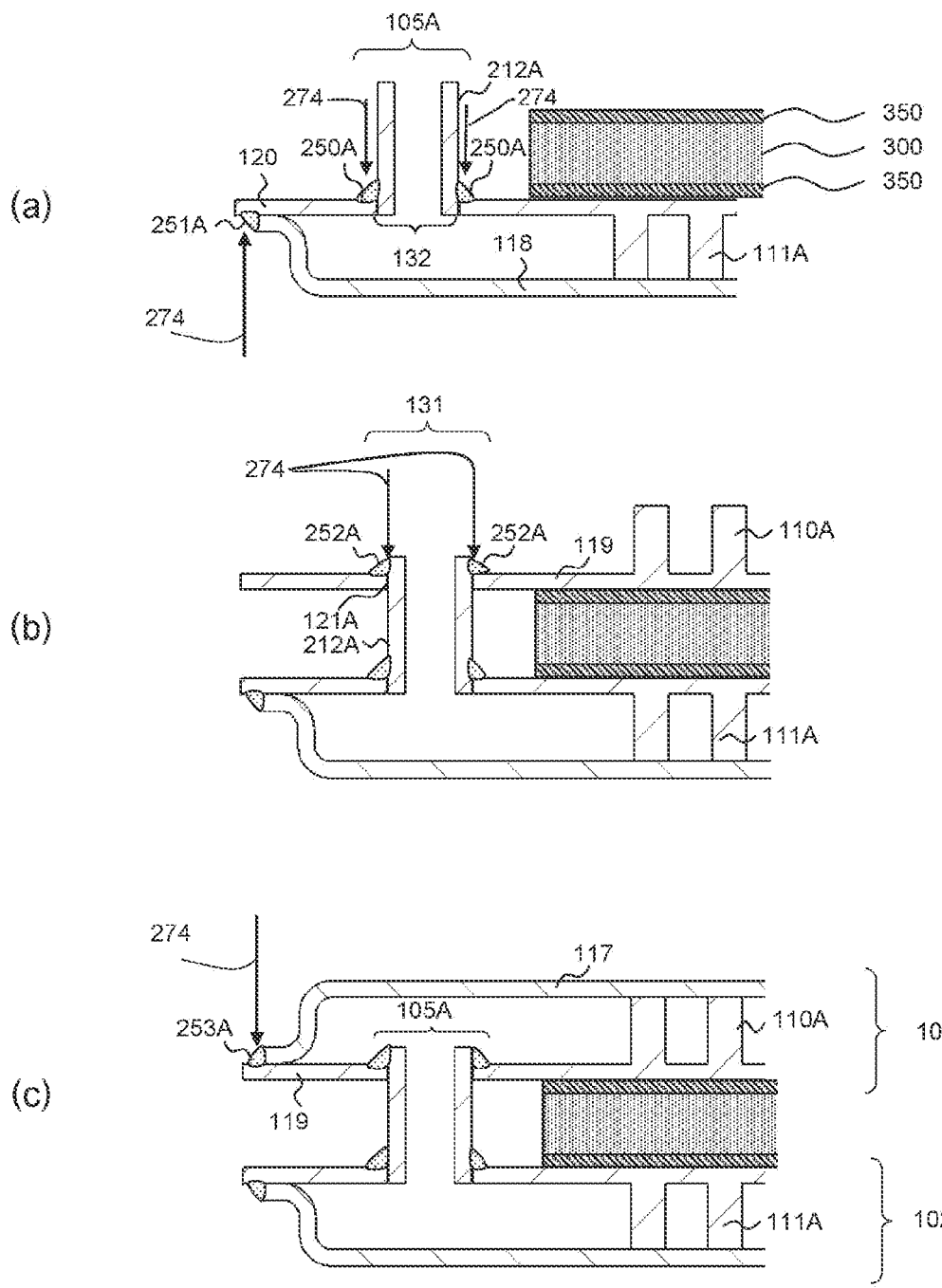
FIG. 14 is a manufacturing step of a connecting water channel according to the second embodiment of the present invention.

FIG. 14 illustrates a manufacturing step of the connecting water channel according to the second embodiment of the present invention.

In FIG. 14(a), the outer surface 212A of the connecting water channel is inserted into the second water channel opening 132, and is joined to the second water channel opening 132 by formation of the first joint 250A.

The first joint 250A is formed by laser welding 274 from the opposite side of the surface of the second water channel base 120 on which the second fins 111A are installed. The first joint 250A may be formed from the surface side of the second water channel base 120 on which the second fins 111A are installed.

The second water channel cover 118 is joined to the second water channel base 120 so as to cover the second fins 111A. The second water channel cover 118 is joined to the second water channel base 120 by formation of the second joint 251A.

The second joint 251A is joined by laser welding 274 from the surface side of the second water channel base 120 on which the second fins 111A are installed. The first joint 250A and the second joint 251A may be formed by brazing.

In the second water channel base 120, the molded body 300 and heat radiation members 350 are installed on a surface opposite to a surface on which the second fins 111A are installed.

As illustrated in FIG. 14(b), the first water channel base 119 is installed on a surface opposite to a surface on which the second water channel base 120 is installed in the molded body 300 and the heat conducting members 350.

In the first water channel base 119, the heat conducting member 350 is pressed against the surface opposite to the surface on which the first fins 110A are installed. The outer surface 212A of the connecting water channel is inserted into the first water channel opening 131. The connecting water channel outer surface 212A is joined to the first water channel opening 131 by formation of the third joint 252.

The third joint 252A is welded and formed by laser welding 274 from the surface side of the first water channel base 119 on which the first fins 110A are installed. The first water channel base 119 can maintain adhesiveness between the first water channel 101A and the second water channel 102A and the heat conducting member 350 by joining the third joint 252A in a state of being pressed against the heat conducting member 350.

In FIG. 14(c), the first water channel cover 117 is pressed against the first water channel base 119, and the first water channel base 119 is joined to the first water channel cover 117 by formation of the fourth joint 253A. The fourth joint 253A is joined by laser welding 274 from the surface side of the first water channel base 119 on which the first fins 110A are installed.

Through the above manufacturing step, the openings 131 and 132 for communicating with the first water channel 101A are formed in the connecting water channel 105A, and the first water channel 101A is joined by a surface along the axial direction of the opening 131 in the connecting water channel 105A. As a result, the water channel covers 117 and 118 are provided in the water channels 101A and 102A, and joining can be performed by laser welding 274 from the stacking direction of the water channels 101A and 102A in the manufacturing step. The laser welding 274 can be substituted by TIG welding, MIG welding, FSW, FIPG, a water-resistant adhesive, or the like.

Figure 15:
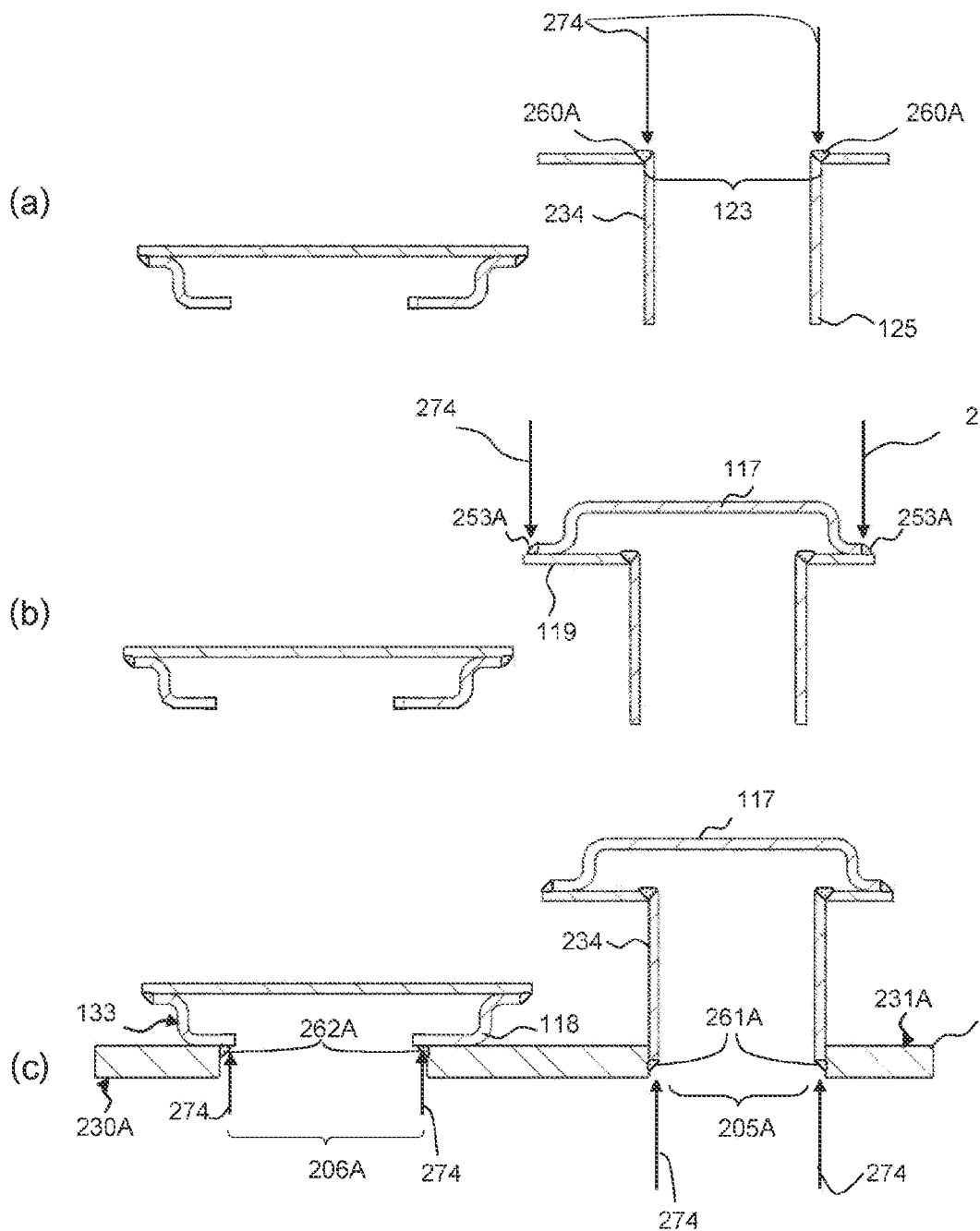
FIG. 15 is a manufacturing step of a water channel according to the second embodiment of the present invention.

FIG. 15 illustrates a manufacturing step of the water channel according to the second embodiment of the present invention.

In FIG. 15(a), the water channel pipe outer surface 234 is inserted into the third water channel base opening 123. The water channel pipe outer surface 234 is joined to the third water channel base opening 123 by formation of the fifth joint 260A by laser welding 274. The fifth joint 260A is formed from the surface side opposite to the surface of the first water channel base 119 on which the molded body 300 is disposed.

In FIG. 15(b), the first water channel cover 117 is joined to the first water channel base 119 at the fourth joint 253A by laser joining 274.

In FIG. 15(c), the water channel pipe outer surface 234 is inserted into the first flange opening 205A. The first flange opening 205A forms the sixth joint 261A by laser welding 274 in a state where the second water channel cover 118 and the water channel mounting surface 231A are pressed against each other.

The sixth joint 261A is formed by laser joining 274 from the casing mounting surface 230A side of the flange 106A. The second water channel cover outer surface 133 abuts the water channel mounting surface 231A. The second water channel cover outer surface 133 is joined to the second flange opening 206A by laser welding 274 at the seventh joint 262A. The seventh joint 262A is formed from the casing mounting surface 230A side of the flange 106A. As a result, the second water channel cover 118 and the water channel mounting surface 231A are joined at the flange 106A.

By performing laser welding 274 while abutting the second water channel cover outer surface 133 against the water channel mounting surface 231A, manufacturing variations in the stacking direction of the molded body 300, the first water channel 101A, and the second water channel 102A are absorbed.

According to the second embodiment of the present invention described above, the following operational effects are achieved.

(8) A power module 100A that is a power conversion device includes a molded body 300 that is a semiconductor device, a first water channel 101A and a second water channel 102A that are stacked in a predetermined stacking direction with the molded body 300 interposed therebetween, and a connecting water channel 105A that connects the first water channel 101A and the second water channel 102A. The connecting water channel 105A is joined to each of the first water channel 101A and the second water channel 102A in a plane perpendicular to the stacking direction of the first water channel 101A and the second water channel 102A. With this configuration, even when the separate members 117 and 118 are manufactured so as to be formed in the water channels 101A and 102A, it is possible to suppress the height of the water channels in the stacking direction while maintaining the press contact with respect to the module body 100, and to achieve both downsizing and improvement in heat dissipation.

Note that the above description is merely an example, and when interpreting the invention, there is no limitation or restriction on the correspondence between the matters described in the above embodiment and the matters described in the claims. For example, the following modifications are conceivable.

Figure 16:
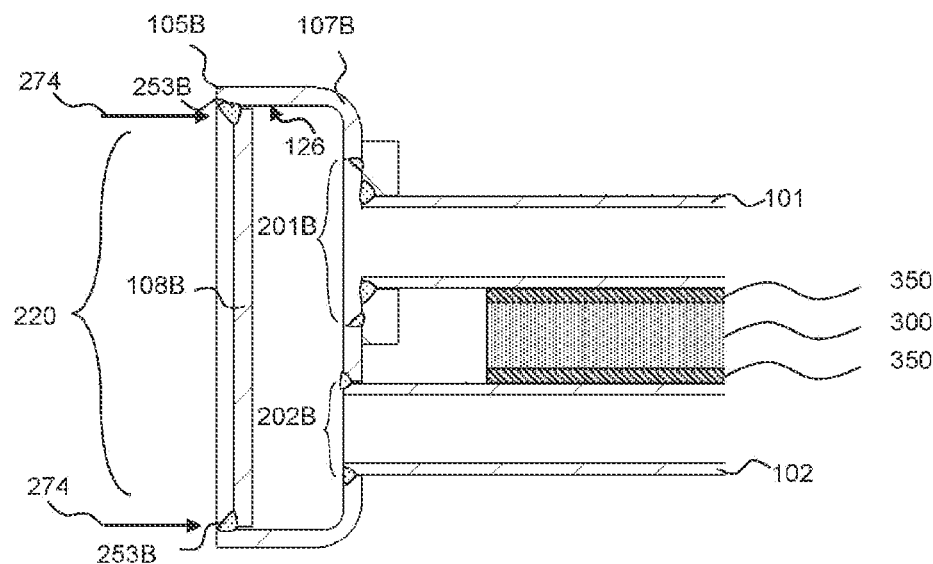
FIG. 16 is a cross-sectional view of Modification 1 of the power conversion device of the present invention.

FIG. 16 is a cross-sectional view of Modification 1 of the power conversion device of the present invention.

In a power module 100B, shapes of the connecting water channel base 107B and the connecting water channel cover 108B are different from those in the first embodiment. Other configurations are the same as those of the first embodiment.

The connecting water channel base 107B has a connecting water channel base wall 126. The connecting water channel base wall 126 is formed in a direction perpendicular to a surface on which the first connecting water channel opening 201B and the second connecting water channel opening 202B are arranged, and is directed in a direction opposite to a direction in which the molded body 300 is provided with reference to the openings 201B and 202B.

The connecting water channel base 107B has a third connecting water channel opening 220. The third connecting water channel opening 220 is surrounded by the connecting water channel base wall 126, and the connecting water channel cover 108B is inserted into the third connecting water channel opening 220.

The connecting water channel cover 108B is a separate member. The third connecting water channel opening 220 is joined to the connecting water channel cover 108B by formation of a fourth joint 253B.

The fourth joint 253B is formed by laser welding 274 in the connecting water channel cover 108B from a direction opposite to a side where the molded body 300 is disposed. The third connecting water channel opening 220 is larger in diameter than the first connecting water channel opening 201B to the second connecting water channel opening 202B.

Figure 17:
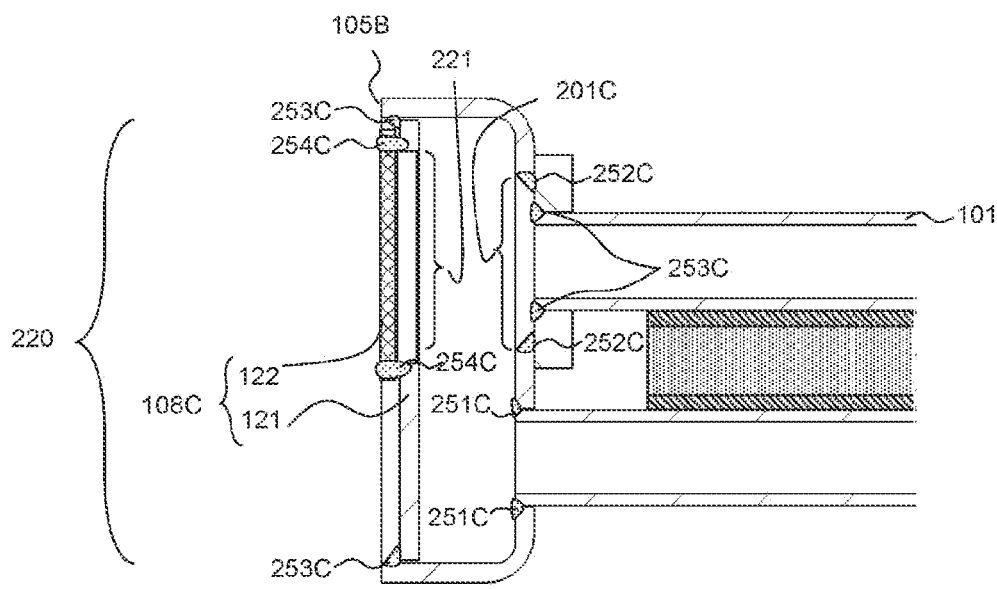
FIG. 17 is a cross-sectional view of Modification 2 of the power conversion device of the present invention.

FIG. 17 is a cross-sectional view of Modification 2 of the power conversion device of the present invention.

A power module 100C is another embodiment of the power module 100B. Compared with the power module 100B, the power module 100C has substantially the same configuration as the power module 100B except that the shape of a connecting water channel cover 108C is characteristic.

The connecting water channel cover 108C is a member separate from a connecting water channel 105B including a first connecting water channel cover 121 and a second connecting water channel cover 122. The first connecting water channel cover 121 is joined to the third connecting water channel opening 220 by formation of a fourth joint 253C.

The first connecting water channel cover 121 has a fourth connecting water channel opening 221. The fourth connecting water channel opening 221 is larger than a first connecting water channel opening 201C. Furthermore, in the fourth connecting water channel opening 221, the entire first connecting water channel opening 201C can be seen when viewed from the side opposite to the side of the first connecting water channel cover 121 on which the molded body 300 is disposed.

As a result, when it is necessary to connect the first water channel 101 and the connecting water channel 105B later due to the procedure of the step, even if the first connecting water channel cover 121 is already joined, a third joint 252C and the fourth joint 253C can be formed by laser welding using the fourth connecting water channel opening 221.

The second connecting water channel cover 122 has a size of closing or substantially the same size as the fourth connecting water channel opening 221, and is joined to the first connecting water channel cover 121 by formation of a fifth joint 254C. The fifth joint 254C is joined after the joining step of the third joint 252C.

The fourth joint 253C is not necessarily formed by laser welding, and may be formed by brazing. In addition, a second joint 251C and the fourth joint 253C can be joined by laser welding or collective joined by brazing. Although it is necessary to consider that productivity is lowered, the fourth connecting water channel opening 221 may be smaller than the first connecting water channel opening 201C.

Figure 18:
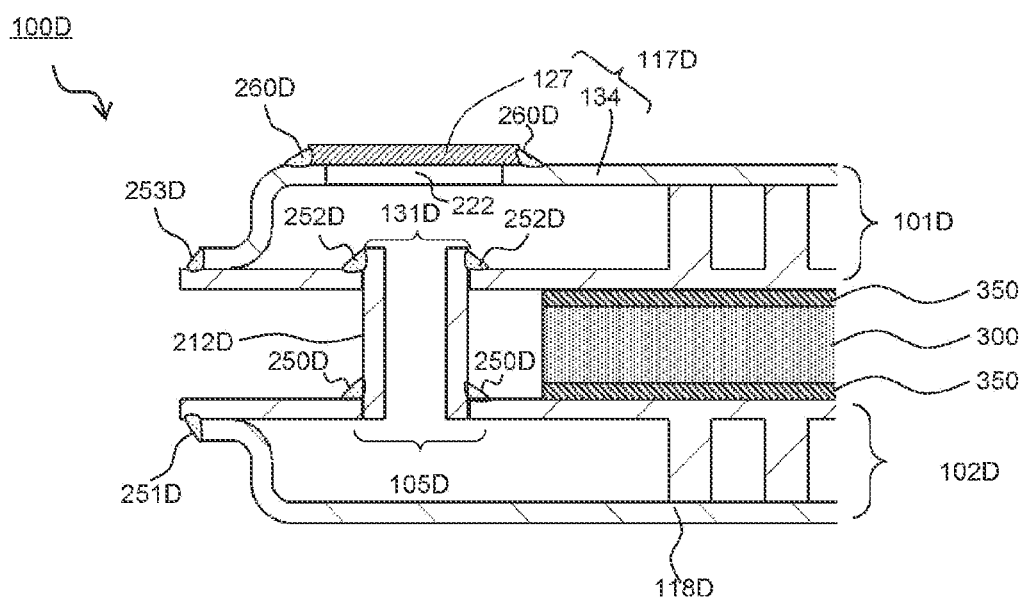
FIG. 18 is a cross-sectional view of Modification 3 of the power conversion device of the present invention.

FIG. 18 is a cross-sectional view of Modification 3 of the power conversion device of the present invention.

A power module 100D is another embodiment of the power module 100A. The power module 100D has the same configuration as the power module 100A except for a third water channel cover 134, a fourth water channel cover 127, a first water channel cover opening 222, and a fifth joint 260D.

A first water channel cover 117D includes the third water channel cover 134 and the fourth water channel cover 127. The third water channel cover 134 has the first water channel cover opening 222.

The first water channel cover opening 222 is larger than a diameter area of a first water channel opening 131D. The first water channel cover opening 222 has a position and a size at which the first water channel opening 131D can be seen when the inside of a first water channel 101D is viewed from the outside.

An outer surface 212D of the connecting water channel is joined to the first water channel opening 131D by formation of a third joint 252D. The third joint 252D is joined by laser welding through the first water channel cover opening 222.

The fourth water channel cover 127 is larger than or substantially equal to the first water channel cover opening 222. The fourth water channel cover 127 is formed so as to close the first water channel cover opening 222 after formation of the third joint 252D. The fourth water channel cover 127 is joined to the third water channel cover 134 by formation of the fifth joint 260D.

The fourth water channel cover 127 is a separate member. The fifth joint 260D is formed by laser welding from the side opposite to the side where the molded body 300 is disposed in the fourth water channel cover 127. The fifth joint 260D is formed after the joining step of the third joint 252D.

A fourth joint 253D is not necessarily formed by laser welding, and may be formed by brazing. The first joint 250D, the second joint 251D, and the fourth joint 253D may be formed by laser welding, but can be collectively joined by brazing. When the first joint 250D, the second joint 251D, and the fourth joint 253D are brazed, the joint length of laser welding can be shortened, and thus thermal deformation of laser welding can be reduced.

Figure 19:
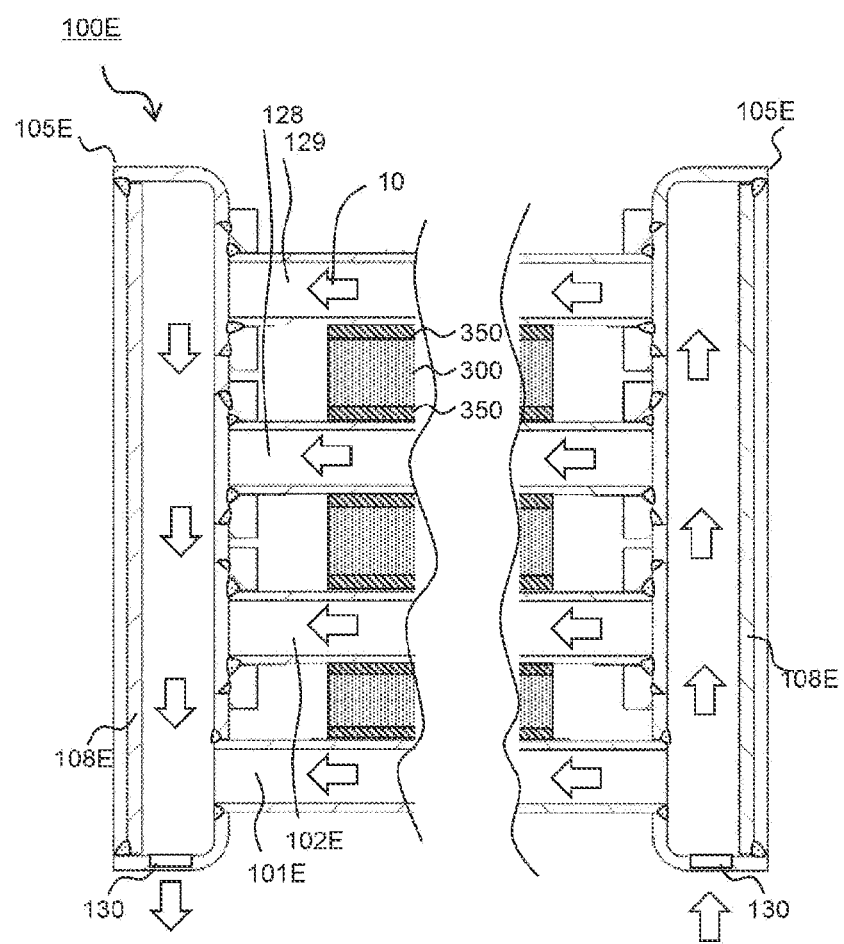
FIG. 19 is a cross-sectional view of Modification 4 of the power conversion device of the present invention.

FIG. 19 is a cross-sectional view of Modification 4 of the power conversion device of the present invention.

A power module 100E is different from the power module 100 in a configuration in which a plurality of molded bodies 300, and a third water channel 128E and a fourth water channel 129E sandwiching the molded bodies 300 overlap each other in the stacking direction of the molded bodies 300.

The power module 100E has three stages in the figure, but may have two stages or more than three stages. The power module 100E also has a connecting water channel 105E on the opposite side across the region where the molded bodies 300 are stacked. The connecting water channel 105E has a water channel inlet/outlet port 130 through which the refrigerant enters and exits.

Figure 20:
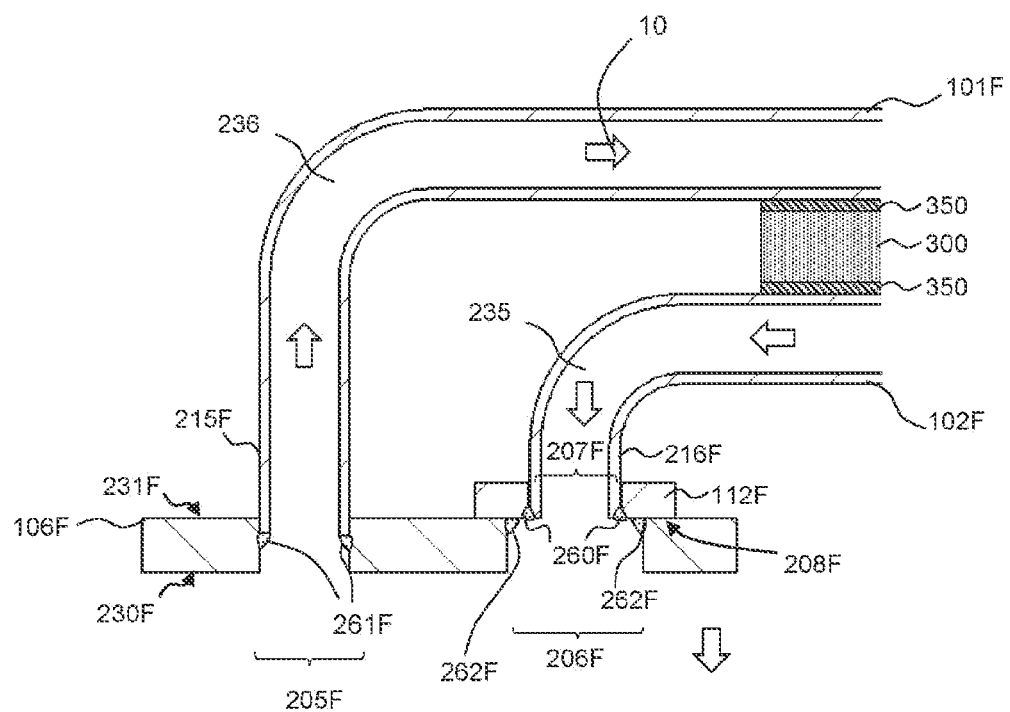
FIG. 20 is a cross-sectional view of Modification 5 of the power conversion device of the present invention.

FIG. 20 is a cross-sectional view of Modification 5 of the power conversion device of the present invention.

A first water channel 101F has a first water channel curved portion 236F. The first water channel curved portion 236 vertically bends the first water channel 101F and is connected to a flange 106F on an extension. A second water channel 102F has a second water channel curved portion 235, bends the second water channel 102F to hydraulic power, and is connected to the flange 106F on an extension.

The second water channel outer surface 216F is inserted into a header flange opening 207F of a header flange 112F, and is joined to the header flange opening 207F by formation of a fifth joint 260F.

A first water channel outer surface 215F is inserted into a first flange opening 205F, and is joined to the first flange opening 205F by formation of a sixth joint 261F in a state where a header flange outer surface 208F abuts on a water channel attachment surface 231F.

A second flange opening 206F is joined to the header flange outer surface 208F by formation of a seventh joint 262F. The first water channel outer surface 215F is inserted into the first flange opening 205F. In addition, the header flange outer surface 208F is pressed against the path attachment surface 231F, whereby it is possible to absorb assembly variations in the stacking direction and the vertical plane direction of the molded body 300, the first water channel 101F, and the second water channel 102F.

Although the modification has been described above, deletion, replacement with another configuration, and addition of another configuration can be performed without departing from the technical idea of the invention, and an aspect thereof is also included in the scope of the present invention. Furthermore, a configuration in which the above-described embodiment and a plurality of modifications are combined may be adopted.

REFERENCE SIGNS LIST 10 flow of refrigerant
100, 100A to E power module
101, 101A, 101D to F first water channel
102, 102A, 102D to F second water channel
103 first header
104 second header
105, 105A, 105B, 105E connecting water channel
106, 106A, 106F flange
107 connecting water channel base
108 connecting water channel cover
109 connecting water channel flange
110, 110A first fin
111, 111A second fin
112, 112F header flange
113 first header case
114 first header cover
115 second header case
116 second header cover
117, 117D first water channel cover
118 second water channel cover
119 first water channel base
120 second water channel base
121 first connecting water channel cover
122 second connecting water channel cover
123 third water channel base opening
124 second water channel cover opening
125 water channel pipe
126 connecting water channel base wall
127 fourth water channel cover
128 third water channel
129 fourth water channel
130 water channel inlet/outlet port
131, 131D first water channel opening
132 second water channel opening
133 second water channel cover outer surface portion
134 third water channel cover
201 first connecting water channel opening
202 second connecting water channel opening
203 first header opening
204 second header opening
205, 205A, 205F first flange opening
206, 206A, 206F second flange opening
207, 207F header flange opening
208, 208F header flange outer surface
209 first header case outer surface
210 third header opening
211 fourth header opening
212, 212A, 212D outer surface of connecting water channel
213 connecting water channel flange opening
214 connecting water channel flange outer surface
215, 215F first water channel outer surface
216, 216F second water channel outer surface
217 connecting water channel base inner surface
218 connecting water channel cover inner surface
219 curved portion
220 third connecting water channel opening
221 fourth connecting water channel opening
222 first water channel cover opening
230, 230A casing mounting surface
231, 231A, 231F water channel (header) mounting surface
232 fifth header opening
233 sixth header opening
234 water channel pipe outer surface
235 second water channel curved portion
236 first water channel curved portion
250, 250D first joint
251, 251A, 251C, 251D second joint 252, 252A, 252D third joint
253, 253A to D fourth joint
260, 260A, 260D, 260F fifth joint
261, 261A, 261F sixth joint
262, 262A, 262F seventh joint
263 eighth joint
264 ninth joint
265 tenth joint
266 eleventh joint
274 laser welding
300 semiconductor device (molded body)
300U upper arm
300L lower arm
311 DC positive terminal
312 DC negative terminal
313 AC terminal
314 signal terminal
315 signal terminal
321U IGBT
321L IGBT
322U diode
322L diode
330 sealing resin
341 first heat sink
342 second heat sink
343 first heat radiation surface
344 second heat radiation surface
345 first joining material
346 second joining material
350 heat conducting member

The invention claimed is:

1. A power conversion device comprising:
a semiconductor device;
a first water channel and a second water channel which are stacked in a predetermined stacking direction and installed with the semiconductor device interposed therebetween; and
a connecting water channel that connects the first water channel and the second water channel, wherein
the connecting water channel is formed by joining and fixing a joint member joined to the first water channel and the second water channel and a cover member separate from the joint member to each other,
the first water channel and the second water channel are joined to the joint member by a joint formed in a plane parallel to the stacking direction, and
the cover member covers the joint and is joined and fixed to the joint member.

2. The power conversion device according to claim 1, wherein
the joint is formed by laser welding.

3. The power conversion device according to claim 1, wherein
the joint member is formed with a first opening for communicating with the first water channel and a second opening for communicating with the second water channel, and
the cover member is a member having an area larger than an area of a region including the first opening and the second opening of the joint member, and is joined and fixed to the joint member on an outer peripheral side of the joint.

4. The power conversion device according to claim 1, wherein
the cover member has a protruding shape having a curved portion.

5. The power conversion device according to claim 1, wherein
an opening for communicating with the first water channel is formed in the joint member, and
the first water channel is joined to the joint member in a plane perpendicular to a flow direction of a refrigerant flowing in the first water channel.

6. The power conversion device according to claim 1, further comprising
a flange member having a flange opening into which the first water channel is inserted, wherein
the first water channel is joined to the joint member via the flange member in a state of being inserted into the flange opening.

7. A method for manufacturing a power conversion device including:
a semiconductor device;
a first water channel and a second water channel which are stacked in a predetermined stacking direction and installed with the semiconductor device interposed therebetween; and
a connecting water channel that connects the first water channel and the second water channel, the method comprising:
joining the second water channel and a joint member;
inserting the first water channel into a flange member;
joining the flange member into which the first water channel is inserted and the joint member in a state where the semiconductor device is sandwiched between the first water channel and the second water channel; and
forming the connecting water channel by covering a joint between the joint member and the flange member and a joint between the second water channel and the joint member and by joining and fixing a cover member separate from the joint member to the joint member.

* * * * *